(12) United States Patent
Abazarnia et al.

(10) Patent No.: US 7,982,478 B2
(45) Date of Patent: Jul. 19, 2011

(54) LIQUID TIM DISPENSE AND REMOVAL METHOD AND ASSEMBLY

(75) Inventors: Nader Abazarnia, Chandler, AZ (US); Ashish X Gupta, Chandler, AZ (US); Suzana Prstic, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 151 days.

(21) Appl. No.: 12/345,234

(22) Filed: Dec. 29, 2008

(65) Prior Publication Data

US 2010/0164510 A1 Jul. 1, 2010

(51) Int. Cl.
 *G01R 31/26* (2006.01)
(52) U.S. Cl. .................................. 324/754.04
(58) Field of Classification Search .................. None
 See application file for complete search history.

(56) References Cited

U.S. PATENT DOCUMENTS

| | | | |
|---|---|---|---|
| 6,410,982 B1 * | 6/2002 | Brownell et al. | 257/714 |
| 6,651,736 B2 * | 11/2003 | Chiu et al. | 257/746 |
| 6,836,408 B2 * | 12/2004 | Gektin et al. | 257/707 |
| 6,964,337 B2 * | 11/2005 | Engle | 206/374 |
| 7,005,320 B2 * | 2/2006 | Kwon | 438/108 |
| 7,808,099 B2 * | 10/2010 | Bertrand et al. | 257/707 |
| 2003/0234394 A1 * | 12/2003 | Hussain et al. | 257/48 |
| 2004/0057213 A1 * | 3/2004 | Gektin et al. | 257/713 |
| 2006/0214286 A1 * | 9/2006 | Sir et al. | 257/720 |
| 2008/0174007 A1 * | 7/2008 | Houle et al. | 257/712 |
| 2009/0135567 A1 * | 5/2009 | Fann et al. | 361/722 |
| 2009/0251862 A1 * | 10/2009 | Knickerbocker et al. | 438/15 |
| 2010/0246133 A1 * | 9/2010 | Schmidt et al. | 361/705 |

\* cited by examiner

*Primary Examiner* — Jermele M Hollington
(74) *Attorney, Agent, or Firm* — David L. Guglielmi

(57) ABSTRACT

In some embodiments, a liquid TIM dispense and removal method and assembly is presented. In this regard, a method is introduced including loading an absorbent material of a thermal control unit with a liquid thermal interface material (TIM), pressing the absorbent material against an integrated circuit device causing the liquid TIM to be released, testing the integrated circuit device, and removing the absorbent material from against the integrated circuit device causing the liquid TIM to be reabsorbed. Other embodiments are also disclosed and claimed.

7 Claims, 2 Drawing Sheets

LIQUID TIM DISPENSE AND REMOVAL METHOD AND ASSEMBLY

FIELD OF THE INVENTION

Embodiments of the present invention generally relate to the field of integrated circuit functional test, and, more particularly to a liquid TIM dispense and removal method and assembly.

BACKGROUND OF THE INVENTION

Integrated circuit devices, such as high power semiconductor chips, are typically formed into a package by permanently bonding the die to a package substrate. Functional testing of the completed package is an effective way of discovering defects in the die, however thermal interface materials (TIM) can sometimes result in inadequate thermal contact (with solid TIM) or can be very time consuming to clean (with liquid TIM).

BRIEF DESCRIPTION OF THE DRAWINGS

The present invention is illustrated by way of example and not limitation in the figures of the accompanying drawings in which like references indicate similar elements, and in which.

DETAILED DESCRIPTION

In the following description, for purposes of explanation, numerous specific details are set forth in order to provide a thorough understanding of the invention. It will be apparent, however, to one skilled in the art that embodiments of the invention can be practiced without these specific details. In other instances, structures and devices are shown in block diagram form in order to avoid obscuring the invention.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner in one or more embodiments.

Figure 1:
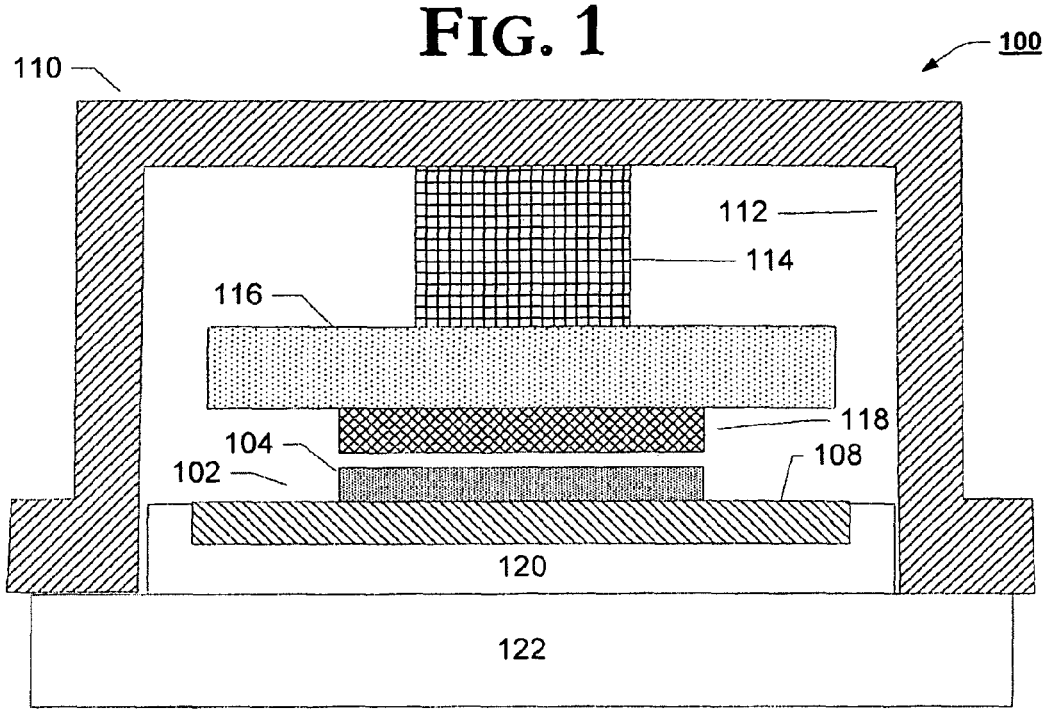
FIG. 1 is a graphical illustration of an example test system for liquid TIM dispense and removal, in accordance with one example embodiment of the invention.

FIG. 1 is a graphical illustration of an example test system for liquid TIM dispense and removal, in accordance with one example embodiment of the invention. In accordance with the illustrated example embodiment, test system 100 includes one or more of integrated circuit package 102, integrated circuit device 104, integrated circuit package substrate 108, thermal control unit 110, chuck 112, pressure device 114, thermal solution 116, absorbent material 118, test socket 120 and test platform 122, as shown in FIG. 1.

Integrated circuit package 102 includes integrated circuit device 104 attached to integrated circuit package substrate 108. In one embodiment, integrated circuit device 104 represents a microprocessor or microcontroller. In one embodiment, integrated circuit device 104 represents a system on a chip. In one embodiment, integrated circuit device 104 represents a flip-chip die with die contacts on an active surface of the die. Integrated circuit package substrate 108 represents a multi-layer substrate designed to be permanently attached with integrated circuit device 104. In one embodiment, integrated circuit package substrate 108 represents a multi-layer organic substrate. Integrated circuit package 102 may also include multiple integrated circuit devices (not shown) and/or an integrated heat spreader (not shown) covering integrated circuit device 104.

Thermal control unit 110 represents an assembly to provide a thermal solution to a device under test. Chuck 112 provides thermal control unit 110 with mechanical support. In one embodiment, chuck 112 mechanically attaches to test platform 122 after integrated circuit package 102 to be tested has been placed in test socket 120. Pressure device 114 is able to provide a force to press thermal solution 116 and absorbent material 118 down into contact with integrated circuit device 104. In one embodiment, pressure device 114 is a bellow that expands and generates a force through air pressure. In another embodiment, pressure device 114 is a mechanical spring or piston. Thermal solution 116 is able to add heat to or remove heat from integrated circuit package 102 as part of process to test the thermal tolerance of integrated circuit device 104.

Absorbent material 118 can hold a liquid TIM, release the liquid TIM when pressed against integrated circuit device 104, and reabsorb the liquid TIM when pulled away from integrated circuit device 104. In one embodiment, absorbent material 118 is a sponge, either natural or synthetic. In one embodiment, absorbent material 118 is a chamois, either natural or synthetic. In other embodiments, absorbent material 118 may be other absorbent natural materials. In other embodiments, absorbent material 118 may be other absorbent synthetic materials.

Test platform 122 may include various system components necessary for running tests, such as, for example chipsets, memory devices, buses, I/O bridges, I/O devices, etc.

Figure 2:
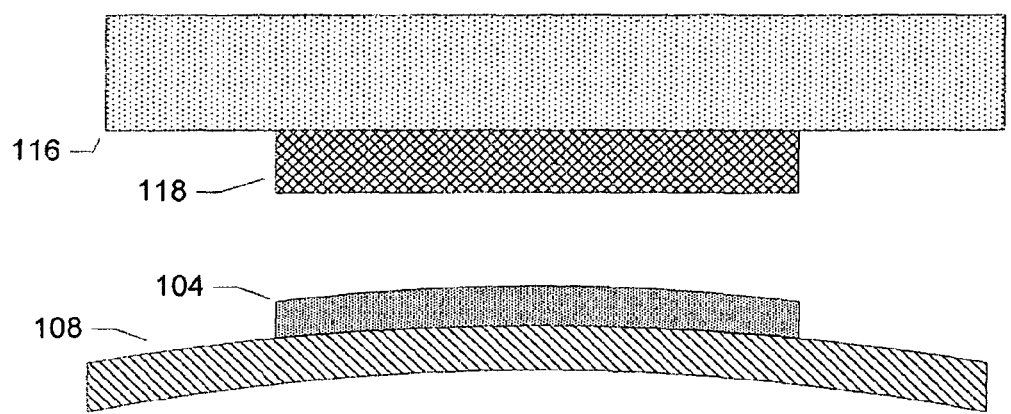
FIG. 2 is a graphical illustration of a close-in view of a liquid TIM dispense and removal assembly, in accordance with one example embodiment of the invention.

FIG. 2 is a graphical illustration of a close-in view of a liquid TIM dispense and removal assembly, in accordance with one example embodiment of the invention. In accordance with the illustrated example embodiment, test system 200 includes one or more of integrated circuit device 104, integrated circuit package substrate 108, thermal solution 116 and absorbent material 118, as shown in FIG. 2.

Thermal solution 116 and absorbent material 118 are positioned above integrated circuit device 104. As shown, integrated circuit device 104 and integrated circuit package substrate 108 have exaggerated bowing to highlight thermal contact limitations of a solid TIM. One skilled in the art would recognize that the thermal contact limitations of a solid TIM could also be present in multiple chip packages with die-to-die height variations, for example.

Figure 3:
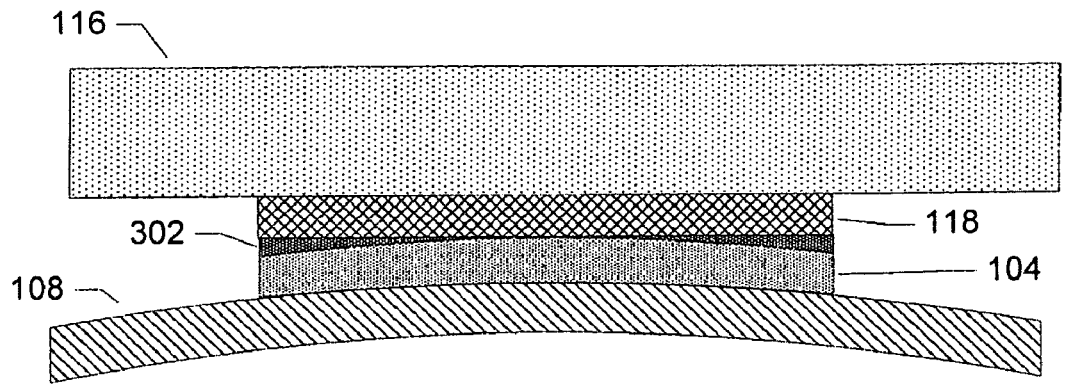
FIG. 3 is a graphical illustration of a close-in view of a liquid TIM dispense and removal assembly, in accordance with one example embodiment of the invention.

FIG. 3 is a graphical illustration of a close-in view of a liquid TIM dispense and removal assembly, in accordance with one example embodiment of the invention. In accordance with the illustrated example embodiment, test system 300 includes one or more of integrated circuit device 104, integrated circuit package substrate 108, thermal solution 116, absorbent material 118 and liquid TIM 302, as shown in FIG. 3.

After thermal solution 116 has been lowered toward integrated circuit device 104, absorbent material 118 is compressed and releases some of liquid TIM 302 that it had been holding. Liquid TIM 302 is able to flow over the surface of integrated circuit device 104 to form a thermal contact between thermal solution 116 and integrated circuit device 104. In one embodiment, liquid TIM 302 is a liquid metal mixture. In another embodiment, liquid TIM 302 is an alcohol mixture.

Figure 4:
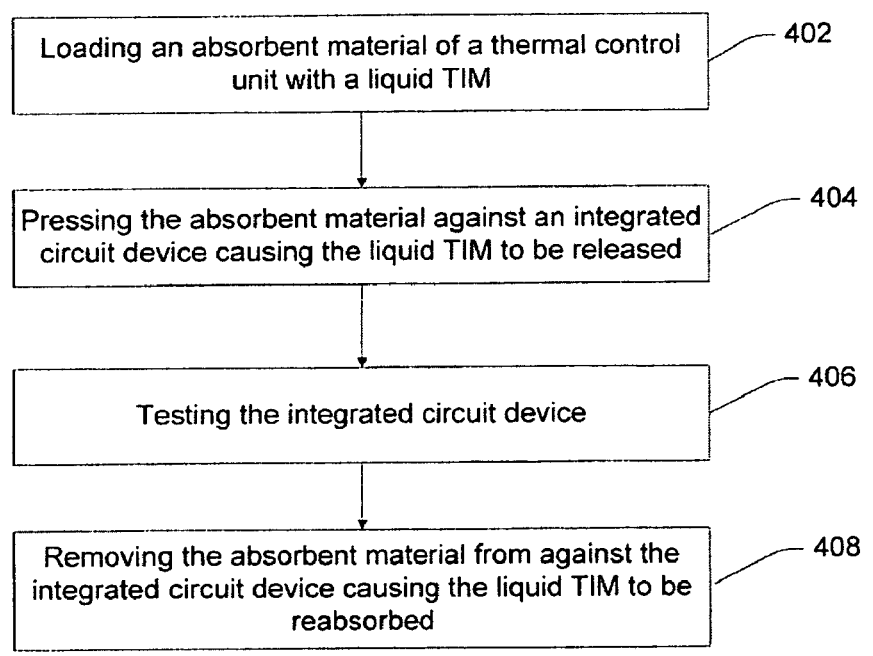
FIG. 4 is a flowchart of an example method of liquid TIM dispense and removal, in accordance with one example embodiment of the invention.

FIG. 4 is a flowchart of an example method of liquid TIM dispense and removal, in accordance with one example embodiment of the invention. As shown, method 400 begins with loading (402) absorbent material 118 of thermal control unit 110 with liquid TIM 302. In one embodiment, liquid TIM 302 is a liquid metal mixture. In another embodiment, liquid TIM 302 is an alcohol mixture.

The method continues with pressing (404) absorbent material 118 against integrated circuit device 104 causing liquid TIM 302 to be released. In one embodiment, pressure device 114 provides a force that compresses absorbent material 118 against integrated circuit device 104. In one embodiment, liquid TIM 302 flows over the surface of integrated circuit device 104 and compensates for variances in height, for example as shown in FIG. 3.

The method continues with testing (406) integrated circuit device 104. In one embodiment, test platform 122 performs functional testing of integrated circuit device 104.

The method continues with removing (408) absorbent material 118 from against integrated circuit device 104 causing liquid TIM 302 to be reabsorbed. In one embodiment, substantially all liquid TIM 302 released is reabsorbed. In another embodiment, liquid TIM 302 that is not reabsorbed may be removed by other means or allowed to evaporate.

In the description above, for the purposes of explanation, numerous specific details are set forth in order to provide a thorough understanding of the present invention. It will be apparent, however, to one skilled in the art that the present invention may be practiced without some of these specific details. In other instances, well-known structures and devices are shown in block diagram form.

Many of the methods are described in their most basic form but operations can be added to or deleted from any of the methods and information can be added or subtracted from any of the described messages without departing from the basic scope of the present invention. Any number of variations of the inventive concept is anticipated within the scope and spirit of the present invention. In this regard, the particular illustrated example embodiments are not provided to limit the invention but merely to illustrate it. Thus, the scope of the present invention is not to be determined by the specific examples provided above but only by the plain language of the following claims.

What is claimed is:

1. A method comprising:
   loading an absorbent material of a thermal control unit with a liquid thermal interface material (TIM);
   pressing the absorbent material against an integrated circuit device causing the liquid TIM to be released;
   testing the integrated circuit device; and
   removing the absorbent material from against the integrated circuit device causing the liquid TIM to be reabsorbed.

2. The method of claim 1, wherein the absorbent material comprises a sponge.

3. The method of claim 1, wherein the absorbent material comprises a chamois.

4. The method of claim 1, wherein the absorbent material comprises a natural material.

5. The method of claim 1, wherein the absorbent material comprises a synthetic material.

6. The method of claim 1, wherein the liquid TIM comprises liquid metal.

7. The method of claim 1, wherein the liquid TIM comprises alcohol.

* * * * *